United States Patent
Poletto et al.

(10) Patent No.: US 10,901,444 B2
(45) Date of Patent: Jan. 26, 2021

(54) DRIVER CIRCUIT, CORRESPONDING DEVICE, APPARATUS AND METHOD

(71) Applicant: STMicroelectronics S.r.l., Agrate Brianza (IT)

(72) Inventors: Vanni Poletto, Milan (IT); Biagio Provinzano, Paris (FR)

(73) Assignee: STMICROELECTRONICS S.R.L., Agrate Brianza (IT)

(*) Notice: Subject to any disclaimer, the term of this patent is extended or adjusted under 35 U.S.C. 154(b) by 0 days.

(21) Appl. No.: 16/777,275

(22) Filed: Jan. 30, 2020

(65) Prior Publication Data

US 2020/0166960 A1    May 28, 2020

Related U.S. Application Data

(63) Continuation of application No. 15/637,225, filed on Jun. 29, 2017, now Pat. No. 10,571,943.

(30) Foreign Application Priority Data

Nov. 25, 2016    (IT) .......................... 102016000119626

(51) Int. Cl.
*H03K 17/042* (2006.01)
*H03K 17/16* (2006.01)
(Continued)

(52) U.S. Cl.
CPC ......... *G05F 1/575* (2013.01); *H03F 3/45475* (2013.01); *H03F 3/45511* (2013.01);
(Continued)

(58) Field of Classification Search
CPC .... H03F 3/45; H03F 3/45071; H03F 3/45076; H03F 3/45475; H03F 3/45479;
(Continued)

(56) References Cited

U.S. PATENT DOCUMENTS 5,469,094 A    11/1995    Nessi
5,886,510 A    3/1999    Crespi et al.
(Continued)

FOREIGN PATENT DOCUMENTS

| EP | 0627810 A1 | 5/1993 |
| EP | 0627818 A1 | 5/1993 |
| JP | 2009302820 A | 12/2009 |

OTHER PUBLICATIONS

Balogh, L.; "Design and Application Guide for High Speed MOSFET Gate Drive Circuits"; 2006; 37 pages.

*Primary Examiner* — Diana J. Cheng
(74) *Attorney, Agent, or Firm* — Slater Matsil, LLP

(57) ABSTRACT

A (pre) driver circuit includes first and second output terminals configured to be coupled to a power transistor. A differential stage has non-inverting and inverting inputs for receiving an input voltage. The input voltage is replicated as an output voltage across the first and second output terminals as a drive signal for the power transistor. The differential stage includes a differential transconductance amplifier in a voltage follower arrangement configured to provide continuous regulation of a voltage at the first output terminal with respect to the second output terminal.

21 Claims, 4 Drawing Sheets

(51) Int. Cl.
- *H03K 17/687* (2006.01)
- *H03K 19/003* (2006.01)
- *G05F 1/575* (2006.01)
- *H03F 3/45* (2006.01)
- *H03F 3/50* (2006.01)

(52) U.S. Cl.
CPC ....... *H03F 3/505* (2013.01); *H03K 17/04206* (2013.01); *H03K 17/166* (2013.01); *H03K 17/687* (2013.01); *H03K 19/00361* (2013.01)

(58) Field of Classification Search
CPC ............. H03F 3/45484; H03F 3/45488; H03F 3/45493; H03F 3/45511; H03F 3/50; H03F 3/505; G05F 1/00; G05F 1/10; G05F 1/46; G05F 1/56; G05F 1/575; H03K 17/00; H03K 17/04; H03K 17/042; H03K 17/04206; H03K 17/16; H03K 17/165; H03K 17/166; H03K 17/51; H03K 17/56; H03K 17/687; H03K 17/6871; H03K 17/6877; H03K 19/00; H03K 19/003; H03K 19/00346; H03K 19/00361

See application file for complete search history.

(56) References Cited

U.S. PATENT DOCUMENTS

| | | |
|---|---|---|
| 6,194,935 B1 | 2/2001 | Pioppo et al. |
| 6,556,062 B1 | 4/2003 | Wallace |
| 2006/0214731 A1* | 9/2006 | Kelly ........................ H03F 1/14 330/292 |
| 2007/0216384 A1 | 9/2007 | Mottola |
| 2015/0349772 A1 | 12/2015 | Schubert et al. |
| 2018/0131365 A1 | 5/2018 | Zojer |

* cited by examiner

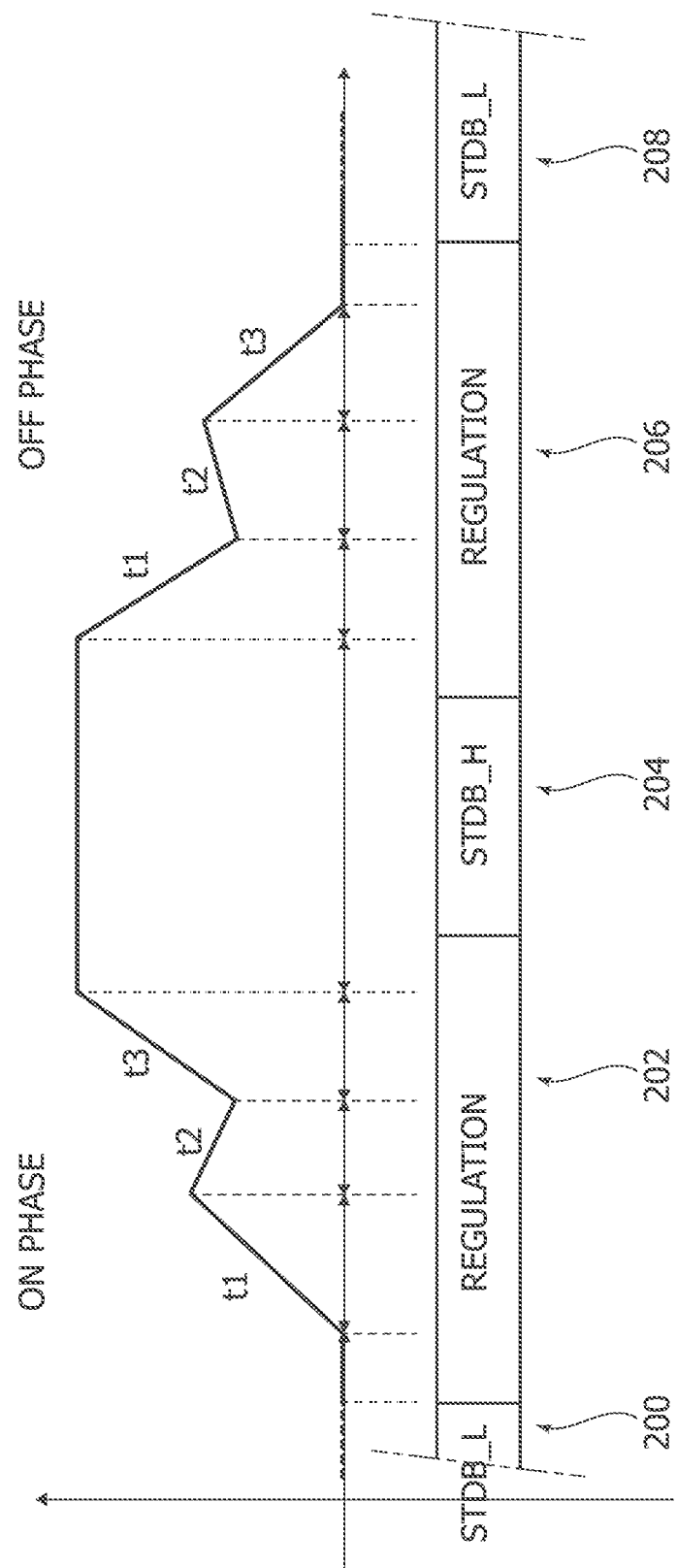

DRIVER CIRCUIT, CORRESPONDING DEVICE, APPARATUS AND METHOD

CROSS-REFERENCE TO RELATED APPLICATIONS

This application is a continuation of U.S. patent application Ser. No. 15/637,225, filed Jun. 29, 2017, which application claims priority to Italian Patent Application No. 102016000119626, filed on Nov. 25, 2016, which applications are hereby incorporated herein by reference.

TECHNICAL FIELD

The description relates to driver circuits as well as a corresponding device, apparatus and method.

BACKGROUND

Pre-driver stages are extensively used in motor control ICs using a half/full-bridge topology; in such arrangements, power FETs are driven by causing large currents to flow through them in order to energize e.g. external coils such as motor windings.

Integrated circuits (ICs) with embedded pre-driver stages can be specifically designed to enable electro-mechanic ("mechatronics") motor control solutions for a range of motor control applications.

In such applications, shaping appropriately the motor phase voltages applied to power FET control is a point of interest. For instance, a basic issue may arise in controlling effectively a complex capacitive load as an external FET, e.g., by shaping its gate-to-source voltage.

A conventional approach may involve a constant source/sink current driver configuration operating in an open loop fashion.

In view of the continuous activity in that area, as witnessed, e.g., by documents such as US2015/0349772 A1, a demand is still felt for improved (pre)driver arrangements.

SUMMARY

One or more embodiments may be used in various applications such as, e.g., electric motor control. One or more embodiments contribute to meeting the demand for improved (pre)driver arrangements.

According to one or more embodiments, improved (pre) driver arrangements are achieved by a circuit having the features set forth in the claims that follow.

One or more embodiments may also relate to a corresponding device (e.g. an IC driver for an electric motor), corresponding apparatus (e.g. an electric motor equipped with a device according to one or more embodiments) and a corresponding method.

One or more embodiments may offer one or more of the following advantages: an operational transconductance amplifier (OTA) topology that facilitates achieving gate voltage shaping from a stability standpoint; facilitated integration of a standby mode configuration using the same output mirrors used for regulation; a compact structure, with area consumption depending primarily on power stages used to drive an external load (e.g. FET), namely the current capability required by the application; continuously driving the gate voltage with a voltage controlled current source (e.g. an OTA) allows output voltage shaping using a simple input structure that can be eventually trimmed to improve regulation accuracy.

BRIEF DESCRIPTION OF THE DRAWINGS

One or more embodiments will now be described, by way of example only, with reference to the annexed figures, wherein:

FIG. 4 is a time diagram exemplary of possible operation of one or more embodiments.

DETAILED DESCRIPTION OF ILLUSTRATIVE EMBODIMENTS

In the ensuing description, one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
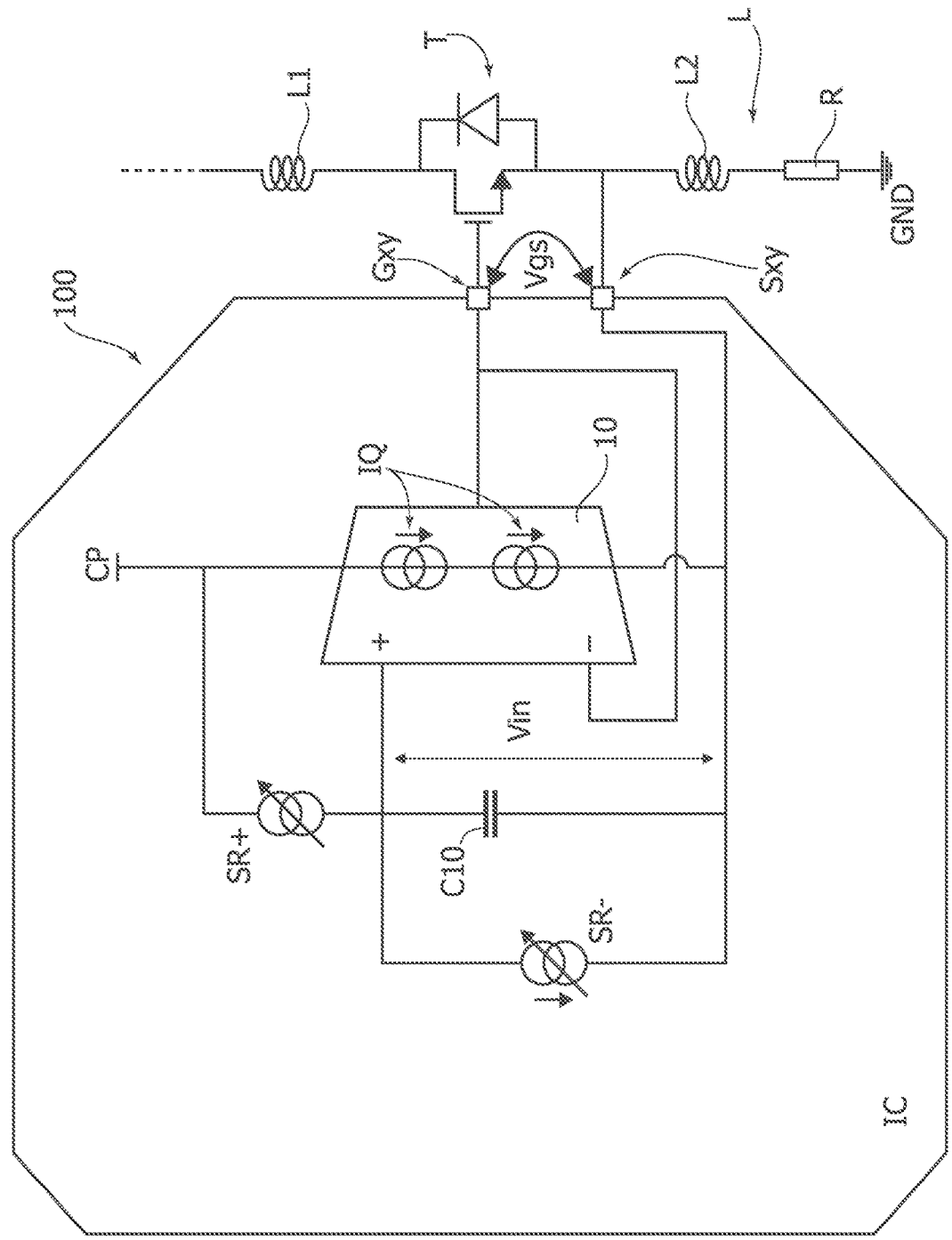
FIG. 1 is a general block diagram of one or more embodiments.

The block diagram of FIG. 1 is exemplary of a (e.g., integrated—IC) pre-driver (e.g., integrated) circuit boo having output terminals Gxy and Sxy for coupling to the gate and source terminals of an external (power) FET T for driving a load L possibly including e.g. inductive components L1, L2 and resistive components R.

A circuit according to one or more embodiments may be used e.g. for driving the high-side (HS) and low-side (LS) FETs which control a terminal such as one of the "phases" of an electric motor such as a brushless motor. The inductance L2 and the resistance R in FIG. 1 may thus be representative of such a motor phase, possibly having one or more external R-C "snubber" networks associated therewith.

Operation of a (pre)driver arrangement as exemplified in FIG. 1 may involve producing between two terminals Gxy and Sxy intended to be coupled e.g. to the gate and source terminals of the FET T a signal Vgs that "copies" an input signal Vin (e.g. a PWM-modulated signal) applied across the inputs (non-inverting and inverting) of a differential stage 10, e.g. an operational transconductance amplifier (hereinafter, briefly, OTA).

In one or more embodiments, the exemplary arrangement of FIG. 1 may include input current source/sink generators SR+, SR− coupled to an e.g. high-impedance (non-inverting) input of the stage 10 in order to act as positive and negative slew rate control, as discussed in the following.

In one or more embodiments, the high-impedance input (+) of the stage 10 may not affect such a slew rate control because its input current is negligible with respect to that of source/sink generators SR+, SR−.

Also, the input (−) of the stage 10 may connect to the output terminal of the stage 10, so that the current at such input (−) can be substantially higher than the current at input (+).

This condition is otherwise optional and not mandatory.

The exemplary arrangement of FIG. 1 may be powered by a (voltage) supply CP and include an input capacitor Cm across the inputs of the differential stage 10.

One or more embodiments may involve an operational transconductance amplifier OTA arrangement based on a "voltage follower" approach in order to continuously regulate the voltage at terminal Gxy (e.g. the gate voltage of the FET T) with respect to the terminal Sxy in order to achieve better and smoother voltage control during switching transients.

An OTA regulation scheme may provide the benefit of being stability-compensated by a capacitance (e.g. the gate-source capacitance Cgs of the external FET T) acting as dominant pole for the whole structure: this facilitates implementing a loop regulation in unitary feedback configuration. In one or more embodiments, stability and transient response of an arrangement as exemplified in FIG. 1 may be observed to be dependent on the capacitive component of the FET T as seen from the circuit 100 e.g. on Cgs plus Cgd(Vgd), where Cgd(Vgd) denotes the gate-drain capacitance, in turn a function of the gate-drain voltage Vgd.

Under these conditions, while the "external" FET T may be a distinct element from the circuit of one or more embodiments, the dominant pole for the whole structure may be due to the external capacitance associated therewith.

Consequently, in one or more embodiments, a circuit architecture with a certain gain-bandwidth product (GBWP) may be able to "shape" the gate-to-source voltage Vgs starting from an internal voltage (Vin in FIG. 1) that can be easily driven using internal current source/sink generators e.g. the slew rate source SR+ and slew rate sink SR− generators as depicted in FIG. 1.

Figure 2:
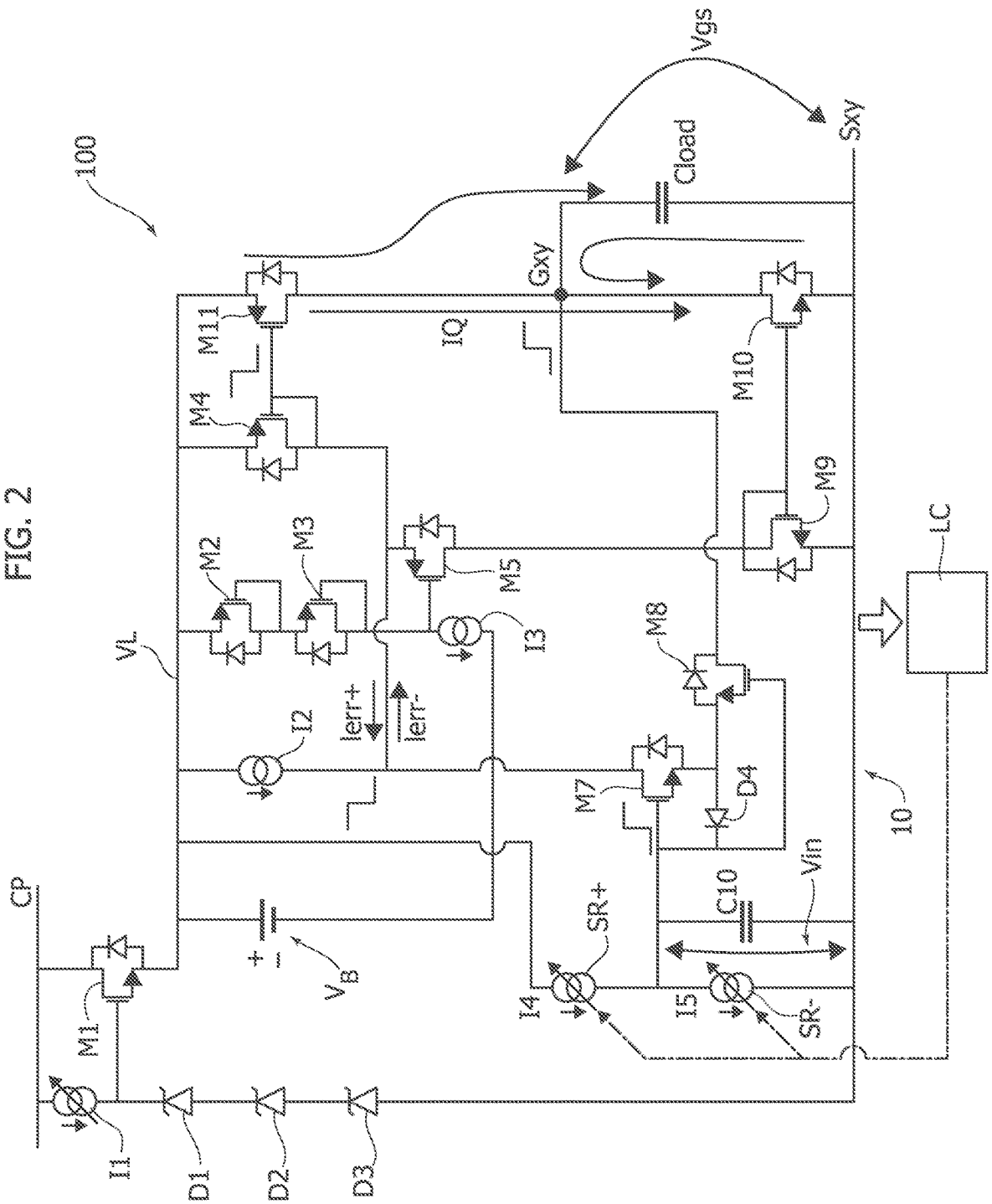
FIG. 2 is a detailed block diagram of one or more embodiments.
Figure 3:
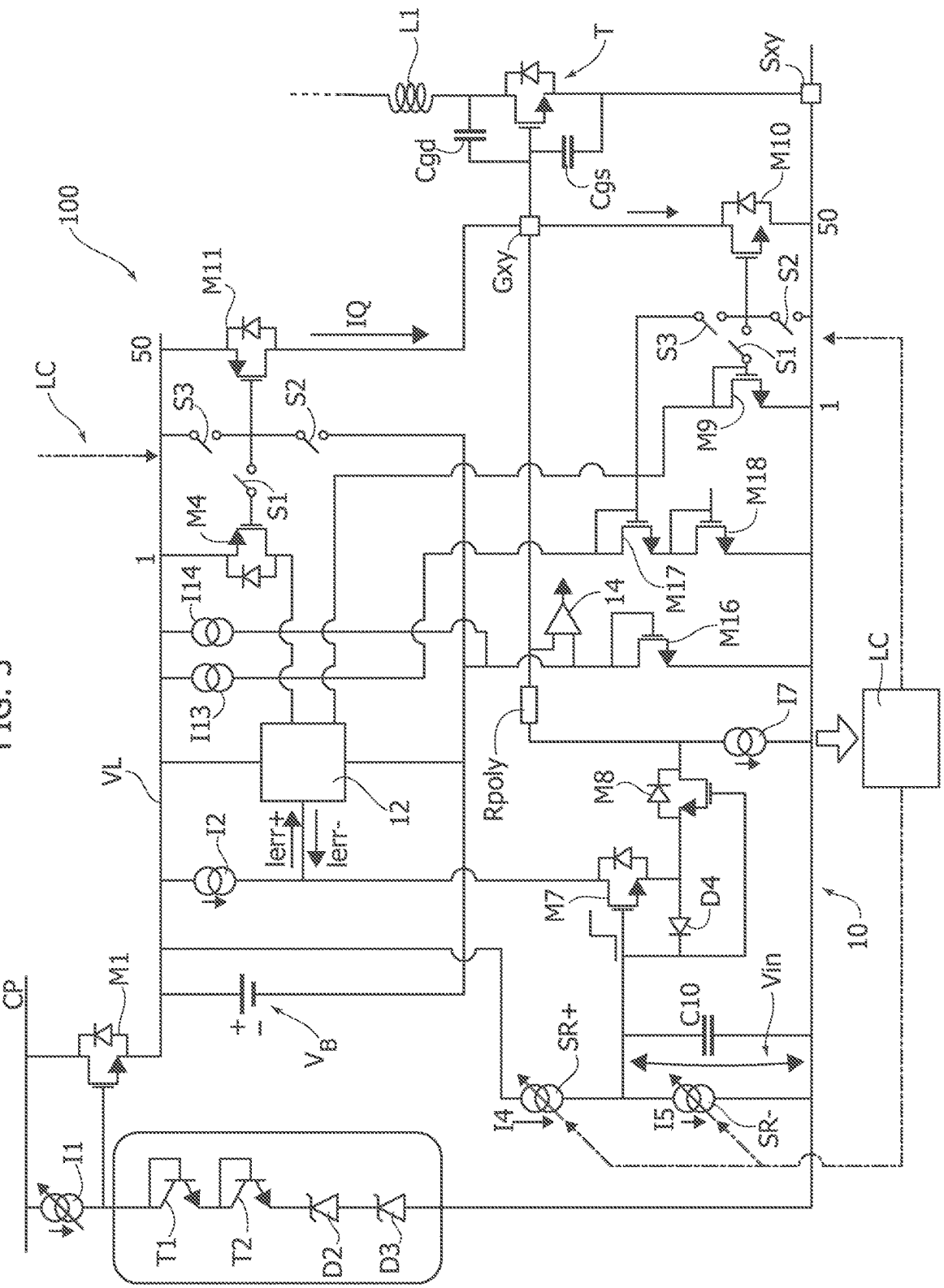
FIG. 3 is a detailed block diagram showing possible features of one or more embodiments.

Possible exemplary implementations of the general layout of FIG. 1 are presented in FIGS. 2 and 3. In FIG. 2, the capacitive component of the FET T is explicitly shown and designated Cload.

Also, the various MOSFETs illustrated in FIGS. 2 and 3 may include a representation of their associated body diodes while the various current generators illustrated may be implemented according to well known principles in the art.

In one or more embodiments as exemplified in FIGS. 2 and 3, in the place of a conventional OTA arrangement with two high impedance input terminals, a floating gate driver may be implemented with only one single high impedance input branch, with the input signal Vin applied to the gate of a MOSFET M7, e.g. across the input capacitor Cm.

In one or more embodiments, the MOSFET M7 may be coupled to the output terminal Gxy, e.g. via the current path (source-drain) of a further MOSFET M8.

The negative input branch of the embodiments as exemplified in FIGS. 2 and 3 corresponds to the drain terminal of MOSFET M8, which connects to the output terminal Gxy of the OTA. In contrast to a conventional OTA arrangement, the negative input does not need to have necessarily high impedance, because the OTA output has sufficient capability of supplying (e.g. via the current path through M8) an amount of current at the OTA negative input without showing malfunctions.

A diode D4 coupled between the source (coupled to the diode anode) and the gate (coupled to the diode cathode) of M7, may be provided with the purpose of protecting the gate oxide of MOSFETS M7 and M8.

For instance (as further discussed with reference to FIG. 4), after having powered up M8 and M7, DC regulation may be set in order to have across the output terminals Gxy, Sxy a voltage Vgs=Vin−Vgs_M7−Rdson_M8·I2, where: Vgs_M7 is the gate-source voltage at M7, Rdson_M8 and I2 are the Rdson resistance and the current through M8.

Due to the selected OTA topology, at each Vgs operating point a DC quiescent current IQ will flow through the current paths (e.g. the source-drain paths) of two MOSFETs M11 and M10 acting as high side and low side (current) mirrors, respectively, having their current paths arranged in series and with the terminal Gxy between M11 and M10, with the source-to-drain drop across Mb corresponding to the gate-source voltage Vgs of the external FET T.

The gain stage may be configured in order to achieve a good trade-off between internal current consumption (IQ) and transient response in tracking variations in the input signal.

One or more embodiments as exemplified in FIG. 2 may provide for the Vgs voltage between Gxy and Sxy being finally clamped at a maximum value.

To that effect, an embedded DC voltage clamp may be provided e.g. as a set of Zener diodes D1, D2 and D3 arranged in series with their anodes facing towards Sxy and their cathodes towards a MOSFET M1 having its gate set between the Zener diodes D1, D2 and D3 and a current generator I1 coupled to the supply line CP. The MOSFET M1 is arranged with its current path (source-drain) between the supply line CP and the cascaded arrangement of the mirrors M11 and M10.

The clamping effect will thus result in the Vgs voltage being clamped at a value: Vgs_max=Vz_D1+Vz_D2+Vz_D3−Vgs_M1, where: Vz_Dii=1, 2, 3 are the Zener voltages of the diodes D1, D2 and D3, and Vgs_M1 is the gate-source voltage of M1.

During the switch-on and -off transients, the gate-to-source voltage of T may be sensed in order to generate an error current signal Ierr+, Ierr− indicative (e.g. proportional) to the error between the input Vin and the output Vgs as in a unity gain OTA buffer configuration.

An exemplary representation of a corresponding AC signal path is shown in FIG. 2 by assuming a small signal variation in Vin.

In one or more embodiments, a corresponding arrangement may include a mirror stage including a MOSFET M4 (mirroring M11) and a MOSFET M9 (mirroring M10), with a further MOSFET M5 having its current path (source drain path) set between the current paths of M4 and M9.

In the exemplary representation of FIG. 2, the mirror MOSFET M4 may be referred to a line VL extending between M1 and M11, with two MOSFETs M2 and M3 arranged with their current paths in series between VL and the gate of M5, with a current generator I3 active on a line connecting the gate of M5 to the line VL via a (bias) voltage source VB.

In one or more embodiments, a current generator I2 may be active on a line between VL and (the drain of) M7 with the error current Ierr+, Ierr− flowing (in both directions) over a line linking an intermediate point between M4 and M5 and an intermediate point between I2 and M7.

The MOSFET M7 will thus be in a position to unbalance (e.g. via M8) the two output mirrors (M4-M11 and M9-M10) in order to provide a current to charge/discharge the external FET T.

In one or more embodiments, the input slew rate generators SR+(current I4) and SR− (current I5) may act between the line VL and the gate of M7 (to which the input voltage Vin is applied) and between the gate of M7 and Sxy, respectively.

This loop strategy facilitates reducing the transistor (e.g. MOSFET) lengths since negative feedback can easily recover internal current mirror offset.

Therefore, in one or more embodiments, area consumption may be mainly due to the final mirror stage (M4-M11 and M9-M10), which can be tailored by taking into account current requirements for various applications.

By combining this input flexibility with an OTA topology, a compact structure with a gate voltage shaping feature may be achieved, which can be tailored (e.g. as regards slew rate selection and time duration) in accordance with the application requirement.

The block diagram of FIG. 3 is exemplary of one or more embodiments of a gate driver arrangement sharing the same basic layout of FIG. 2.

For that reasons, parts or elements corresponding to parts or elements already described in relation with the previous figures are indicated in FIG. 3 with the same references appearing in the previous figures without repeating a corresponding description.

It will otherwise be appreciated that various features distinguishing the exemplary arrangement of FIG. 3 over the exemplary arrangement of FIG. 2 may be applied individually, that is one independently of the others: the combined discussion of these features provided in relation to FIG. 3 is thus for the sake of brevity only and is not to be construed in a limiting sense of the embodiments.

In comparison with FIG. 2, the gate driver arrangement of FIG. 3 (where the gate-drain and gate-sources capacitances Cgd and Cgs of the external FET T are explicitly shown), includes possible variants such as e.g. substituting for one or more of the Zener diodes D1, D2, D3—e.g. for the diode D1—a cascaded arrangement of two bipolar transistors T1, T2 in a diode-like arrangement (with bases shorted to collectors) so that the Vgs voltage may be clamped at a value Vgs_max=Vbe_T1+Vbe_T2+Vz_D2+Vz_D3−Vgs_M1, where Vbe_T1 and Vbe_T2 are the base-emitter voltages of T1 and T2, respectively.

Also, in the gate driver arrangement of FIG. 3 (which may be suitable for implementation with AlCu as top metal layer), the feedback loop may be modified by providing a current generator I7 acting between the output drain of M8 and Sxy, while possibly protecting the Vgs of M7-M8 with the diode D4.

In one or more embodiments, the current generators I2 and I7 may be substantially identical and matched in order to have a better control on the dominant pole as given by fp=K/(2π·Rpoly·Cgate), where the polysilicon resistance Rpoly (explicitly shown in the figure) can be set in order to achieve a desired GBWP frequency behavior, K being the current gain from OTA negative input at drain of M8 to the OTA output at Gxy terminal.

The gate driver arrangement of FIG. 3 may include an OTA regulation block 12 coupled to the mirrors M4-M11 and M9-M10 (and the line V1 and the bias line of bias voltage B).

As in the case of the homologous circuitry of FIG. 2 including the MOSFETs M2, M3 and M5 and the associated components, the OTA regulation block 12 of FIG. 3 may be stimulated by an input error current signal Ierr+, Ierr− (in either direction) indicative e.g. proportional to the difference between the "internal" Vin voltage and the "external" Vgs voltage, so that the two output mirrors (M4-M11 and M9-M10) may be unbalanced (e.g. via M7 and M8) in order to provide a current to charge/discharge the external FET without excessive cross conduction during transients.

In one or more embodiments, a gate driver arrangement as exemplified in FIG. 3 may include a set of switches S1, S2 and S3, which may facilitate reducing internal current consumption after complete Vgs commutation.

In one or more embodiments the switches S1, S2 and S3 may be configured to be selectively switched-off (that is made non-conductive) in order to selectively "isolate" the gates of M11 resp. M10 from: M4 resp. M9 (switches S1); the negative side of bias voltage VB resp. Sxy (switches S2); and the line VL resp. the gate of a MOSFET M17 (switches S3).

The MOSFET M17 is arranged with its current path coupled in series between a current generator I13 coupled to the line VL and the current path of a further MOSFET 18 set between the MOSFET M17 and Sxy.

In one or more embodiments, such an arrangement may permit to produce a reference voltage Vgs18+Vgs17 (i.e. the sum of the Vgs voltages of M18 and M17) for connection to the gate of M10 via a switch S3 as discussed in the following. This may be helpful when desiring that M10 may be fully conductive as a result of the output voltage at Gxy having concluded its transition from VL to Sxy. Similarly, a voltage VB subtracted from V1 may produce a reference voltage V1-VB for connection of the gate of M11 via a switch S2. This may be helpful when desiring that M11 may be fully conductive as a result of the output voltage at Gxy having concluded its transition from Sxy to VL.

In one or more embodiments, a gate driver arrangement as exemplified in FIG. 3 may include a gate-off comparator 14 configured for comparing the output signal on the output terminal Gxy and the signal at a point between a current generator 114 coupled to the line VL and a diode configuration (e.g. MOSFET M16 with gate shorted to drain) arranged between the gate-off comparator 14 and Sxy.

The gate-off comparator 14 may provide information concerning the OFF condition of the external FET, e.g. in order to implement a dead time generation function aimed at avoiding High Side and Low Side FET cross-conduction on motor terminals.

As exemplified in the time diagram of FIG. 4, various phases may thus occur during a complete switching period, including a STANDBY mode functionality.

The time diagram of FIG. 4 is exemplary of a method of operating the circuit of one or more embodiments where a switching period (corresponding e.g. to one cycle of a PWM-modulated input signal V1) may involve subsequent phases 200, 202, 204, 206, 208 including an ON regulation phase (ON PHASE 202) and an OFF regulation phase (OFF PHASE 206) "interleaved" between standby phases, STDBY_L 200 and 208 and STDBY_H 204.

In one or more embodiments STDBY_H at 204 (with S1 off, S2 on and S3 off) may involve the output terminal Gxy pulled "up" while STDBY_L at 200 and 208 (with S1 off, S2 off and S3 on) may involve Gxy pulled "down" (e.g. to Sxy).

In both instances that result may be achieved with low impedance and by using the same power mirror employed for regulation.

Operation of the circuits exemplified herein (e.g. activating the slew rate generators SR+, SR−, turning the switches S1, S2 and S3 on and off, and so on) may be controlled by a logic circuit LC.

In one or more embodiments such a logic circuit may include e.g. a logical multiplexer configured to operate according to a coded signal (control code) devised to control the slew rate (positive or negative) at the input (high voltage) capacitance C10.

For instance, based on the threshold voltage Vth of the external FET and the gm characteristics, the slew rate at the input capacitance C10 may control the overall gate charge/discharge curve in order to smoothen the ringing phenomenon during switching transitions using a real FET Rds modulation.

The diagram of FIG. 4 is exemplary of e.g. three slew rates applied with time durations) e.g. t1, t2, t3 possibly programmable (e.g. via a SPI interface) in order to get an optimal shaping.

The diagram of FIG. 4 is exemplary of possible operation where shaping the gate charging/discharging profile during an ON PHASE e.g. may include: an interval t1 from 0V to Vth; an interval t2 close to the Miller plateau (this may facilitate damping the first RLC series resonance) an interval t3 from the Miller transition to full Vgs, which is controlled to be not so fast in order to avoid a second critical resonant behavior.

One or more embodiments may provide a circuit (e.g. 100), including: first (e.g. Gxy) and second (e.g. Sxy) output terminals coupleable to a power transistor (e.g. T). a differential stage (e.g. an OTA 10) having non-inverting and inverting inputs for receiving an input voltage (e.g. Vin) applied across the non-inverting and inverting inputs where the input voltage is replicated as an output voltage (e.g. Vgs) across the first and second output terminals to provide a drive signal for the power transistor, where the differential stage includes a differential transconductance amplifier (e.g. M7, M8) in a voltage follower arrangement providing continuous regulation of the voltage at the first output terminal with respect to the second output terminal.

In one or more embodiments, the differential transconductance amplifier in a voltage follower arrangement may include at least one of: a high-impedance input (e.g. M7) having coupled therewith input current source resp. sink generators (e.g. SR+, SR− in FIG. 1; I4, I5 in FIGS. 2 and 3) to provide slew rate control, and/or a further input (optionally a low-impedance input, a high-impedance input being also acceptable) coupled (e.g. via M8) to the first output terminal.

In one or more embodiments the differential transconductance amplifier in a voltage follower arrangement may include a first transistor (e.g. M7) having a control electrode (e.g. a gate in the case of FET, a base in the case of a bipolar transistor) to receive the input signal, the first transistor coupled to the first output terminal via the current path (e.g. source-drain in the case of FET, emitter-collector in the case of a bipolar transistor) through a second transistor (e.g. M8).

One or more embodiments may include at least one of: a protection diode (e.g. D4) set between the control electrode of the first transistor and the current path through the second transistor, and/or a current generator (e.g. I7) between the output of the second transistor and the second output terminal.

In one or more embodiments the differential stage may include a voltage clamp (e.g. D1, D2, D3 FIG. 2; T1, T2, D2, D3 in FIG. 3) to clamp at a peak value the output voltage (e.g. Vgs) across the first and second output terminals, the voltage clamp set between the second output terminal and a supply line (e.g. CP) to the circuit.

One or more embodiments may include a sensor (e.g. M5 in FIG. 2; I2 in FIG. 3) configured for sensing the output voltage across the first and second output terminals and generating an error signal (for instance Ierr+, Ierr−) indicative of the error between the input voltage and the output voltage.

In one or more embodiments the differential stage may include high-side (e.g. M11) and low-side (e.g. M10) output current mirrors with the first output terminal set therebetween.

One or more embodiments may include a switch set (e.g. S1, S2, S3) activatable (e.g. via LC) during high- and low-standby phases for selectively decoupling (e.g. switch S1) the output current mirrors from the differential transconductance amplifier while coupling (e.g. via the switches S2, S3) the output current mirrors to a pull-up source (e.g. to VL, in a high-standby phase) and to a pull-down source (e.g. to Sxy, in a low-standby phase) for the first output terminal.

One or more embodiments may provide a driver device (e.g. a driver for an electric motor), including: a circuit according to one or more embodiments, and a power transistor (e.g. T) having a control terminal (e.g. a gate in the case of FET, a base in the case of a bipolar transistor) and current path (e.g. source-drain in the case of FET, emitter-collector in the case of a bipolar transistor), the power transistor having the control terminal and the current path coupled to the first and second output terminals, respectively.

One or more embodiments may provide apparatus (e.g. electric motor), including: a driver device according to one or more embodiments, a load (e.g. a motor winding L) supplied via the power transistor.

One or more embodiments may provide a method of operating a circuit according to one or more embodiments, the method including (see e.g. 200, 202, 204, 206, 208 in FIG. 4) varying the input voltage (and thus the output voltage) through alternate on (e.g. 202) and off (e.g. 206) phases, the method including selectively (see e.g. t1, t2, t3 in FIG. 4) controlling (e.g. via LC) the slew rate (e.g. via SR+, SR−; I4, I5) at the input of the differential stage during the alternate on and off phases.

Without prejudice to the underlying principles, the details and embodiments may vary, even significantly, with respect to what has been disclosed by way of example only, without departing from the extent of protection.

The extent of protection is defined by the annexed claims.

What is claimed is:

1. A circuit comprising:
   a first output terminal configured to be coupled to a control terminal of a power transistor;
   a second output terminal configured to be coupled to a conduction terminal of the power transistor;
   a first current generator; and
   a transconductance amplifier comprising:
      a first transistor having a control terminal coupled to the first current generator, and
      a second transistor having a current path coupled between a current path of the first transistor and the first output terminal, and a control terminal coupled to the control terminal of the first transistor; and
   a capacitor coupled between the control terminal of the first transistor and the second output terminal, wherein the transconductance amplifier is configured to receive an input voltage across the capacitor, and produce a regulated output voltage at the first output terminal with respect to the second output terminal based on the input voltage, and wherein the first current generator is configured to provide slew rate control at the control terminal of the first transistor.

2. The circuit of claim 1, further comprising a first diode having a cathode coupled to the control terminal of the first transistor, and an anode coupled at an intermediate node that is coupled between the current path of the first transistor and the current path of the second transistor.

3. The circuit of claim 1, further comprising a second current generator coupled between the control terminal of the first transistor and the second output terminal.

4. The circuit of claim 1, further comprising:
a first current mirror comprising third and fourth transistors, the fourth transistor having a current path coupled between a supply line and the first output terminal; and
a second current mirror comprising fifth and sixth transistors, the sixth transistor having a current path coupled between the first output terminal and the second output terminal, wherein a current path of the third transistor is coupled to the current path of the first transistor.

5. The circuit of claim 4, further comprising a seventh transistor having a current path coupled between the current path of the third transistor and a current path of the fifth transistor.

6. The circuit of claim 5, further comprising an eighth transistor having a current path coupled between the supply line and a control terminal of the fifth transistor.

7. The circuit of claim 4, further comprising:
a seventh transistor having a current path coupled to the supply line; and
a first diode coupled between a control terminal of the seventh transistor and the second output terminal.

8. A circuit comprising:
a first output terminal configured to be coupled to a control terminal of a power transistor;
a second output terminal configured to be coupled to a conduction terminal of the power transistor;
a first current generator;
a transconductance amplifier comprising:
  a first transistor having a control terminal coupled to the first current generator, and
  a second transistor having a current path coupled between a current path of the first transistor and the first output terminal, and a control terminal coupled to the control terminal of the first transistor;
a capacitor coupled between the control terminal of the first transistor and the second output terminal;
a third transistor having a current path coupled between the first output terminal and the second output terminal;
a fourth transistor having a current path coupled to the second output terminal;
a first switch coupled between a control terminal of the third transistor and a control terminal of the fourth transistor;
a fifth transistor having a current path coupled to a supply line;
a sixth transistor having a current path coupled between the supply line and the first output terminal;
a second switch coupled between a control terminal of the fifth transistor and a control terminal of the sixth transistor; and
a control circuit, wherein the transconductance amplifier is configured to receive an input voltage alternating between on and off phases across the capacitor, and produce a regulated output voltage at the first output terminal with respect to the second output terminal based on the input voltage, wherein the control circuit is configured to turn off the first and second switches during standby phases that are interleaved between the on and off phases, and wherein the first current generator is configured to provide slew rate control at the control terminal of the first transistor.

9. The circuit of claim 8, further comprising:
a third switch coupled between the control terminal of the third transistor and the second output terminal; and
a fourth switch coupled between the supply line and the control terminal of the sixth transistor.

10. The circuit of claim 9, further comprising:
a seventh transistor having a current path coupled to the second output terminal;
a fifth switch coupled between a control terminal of the seventh transistor and the control terminal of the third transistor;
an eighth transistor having a current path coupled to the second output terminal; and
a sixth switch coupled between the current path of the eighth transistor and the control terminal of the sixth transistor.

11. The circuit of claim 10, further comprising a comparator having a first input coupled to the first output terminal, and a second input coupled to the current path of the eighth transistor.

12. The circuit of claim 8, further comprising a sensor coupled to the current path of the fourth transistor and to the current path of the fifth transistor, the sensor configured to sense the regulated output voltage and to generate an error signal at a sensor node indicative of an error between the input voltage and the regulated output voltage.

13. The circuit of claim 12, wherein the sensor node is coupled to the current path of the first transistor.

14. The circuit of claim 8, further comprising a first diode having a cathode coupled to the control terminal of the first transistor, and an anode coupled at an intermediate node that is coupled between the current path of the first transistor and the current path of the second transistor.

15. The circuit of claim 8, further comprising a second current generator coupled between the control terminal of the first transistor and the second output terminal.

16. The circuit of claim 8, further comprising:
a seventh transistor having a current path coupled to the supply line; and
a first diode coupled between a control terminal of the seventh transistor and the second output terminal.

17. The circuit of claim 16, further comprising a bipolar transistor coupled between the control terminal of the seventh transistor and the first diode.

18. A method of operating a driver having a first output terminal coupled to a control terminal of a power transistor, and a second output terminals coupled to a first conduction terminal of the power transistor, the method comprising:
receiving an input voltage across a capacitor, wherein the capacitor has a first terminal coupled to a first input of a transconductance amplifier of the driver and a second terminal coupled to the second output terminal, wherein the input voltage alternates between on and off phases;
producing a regulated output voltage between the control terminal of the power transistor and the first conduction terminal of the power transistor based on the input voltage with the transconductance amplifier; and
selectively controlling a slew rate at the first input of the transconductance amplifier during the alternate on and off phases of the input voltage with first and second current generators, wherein the first current generator is coupled between the first input of the transconductance amplifier and a voltage supply terminal, wherein the second current generator is coupled between the first input of the transconductance amplifier and the second output terminal, and wherein selectively controlling the slew rate at the first input of the transconductance amplifier comprises:

during the on phase,
- generating a first slew rate for a first time duration,
- generating a second slew rate for a second time duration, wherein the second slew rate is different from the first slew rate, and
- generating a third slew rate for a third time duration, wherein the third slew rate is different from the second slew rate, and during the off phase,
- generating a fourth slew rate for a fourth time duration,
- generating a fifth slew rate for a fifth time duration, wherein the fifth slew rate is different from the fourth slew rate, and
- generating a sixth slew rate for a sixth time duration, wherein the sixth slew rate is different from the fifth slew rate.

19. The method of claim 18, wherein:
the first time duration is equal to the fourth time duration;
the second time duration is equal to the fifth time duration; and
the third time duration is equal to the sixth time duration.

20. The method of claim 18, wherein:
the first slew rate has positive slope;
the second slew rate has negative slope; and
the third slew rate has positive slope.

21. The method of claim 18, wherein:
the fourth slew rate has negative slope;
the fifth slew rate has positive slope; and
the sixth slew rate has negative slope.

* * * * *